US010091913B2

(12) United States Patent
Shimasaki

(10) Patent No.: US 10,091,913 B2
(45) Date of Patent: Oct. 2, 2018

(54) LIQUID COOLING SERVER

(71) Applicant: FUJITSU LIMITED, Kawasaki-shi, Kanagawa (JP)

(72) Inventor: Akira Shimasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/484,810

(22) Filed: Apr. 11, 2017

(65) Prior Publication Data

US 2017/0303440 A1    Oct. 19, 2017

(30) Foreign Application Priority Data

Apr. 19, 2016    (JP) ................................. 2016-083898

(51) Int. Cl.
*H05K 7/20*    (2006.01)
*G06F 1/20*    (2006.01)

(52) U.S. Cl.
CPC ..... *H05K 7/20781* (2013.01); *H05K 7/20254* (2013.01); *H05K 7/20509* (2013.01)

(58) Field of Classification Search
CPC ........... H95K 7/20254; H95K 7/20509; H95K 7/20627–7/20645; H95K 7/20763–7/20781; H01L 23/4338
See application file for complete search history.

(56) References Cited

U.S. PATENT DOCUMENTS

| | | | | | |
|---|---|---|---|---|---|
| 4,884,167 | A | * | 11/1989 | Mine | H01L 23/4338 257/E23.094 |
| 5,245,508 | A | * | 9/1993 | Mizzi | H05K 7/20636 165/185 |
| 7,212,409 | B1 | * | 5/2007 | Belady | G06F 1/20 361/721 |
| 7,312,987 | B1 | * | 12/2007 | Konshak | G06F 1/20 165/80.4 |
| 8,000,103 | B2 | * | 8/2011 | Lipp | F28D 1/05316 165/104.33 |
| 8,817,473 | B2 | * | 8/2014 | Babish | H01L 23/473 165/80.4 |

(Continued)

FOREIGN PATENT DOCUMENTS

DE   10112389 A1 * 10/2002 ......... H05K 7/20645
EP   0580412 A1 *  1/1994 ......... H05K 7/20636

(Continued)

*Primary Examiner* — Robert J Hoffberg
(74) *Attorney, Agent, or Firm* — Fujitsu Patent Center

(57) ABSTRACT

A liquid cooling server includes a chassis including a unit case housing portion; a unit case which moves in a first direction for being inserted in and pulled out from the unit case housing portion and includes a heat generating component and a portion to be cooled; a cooling plate which is disposed to the chassis, opposes the unit case housing portion in a second direction perpendicular to the first direction, and includes a flow path through which a cooling medium flows; a metal portion which is provided to either one of the cooling plate and the portion to be cooled, includes a plurality of first protrusions which protrude in the second direction towards the unit case housing portion and are arranged in the first direction; and a heat transfer body provided between the metal portion and the first member in the second direction, the heat transfer body being elasticity.

19 Claims, 13 Drawing Sheets

(56) References Cited

U.S. PATENT DOCUMENTS

| | | | | |
|---|---|---|---|---|
| 8,879,258 B1* | 11/2014 | Babish | ................. | H01L 23/473 |
| | | | | 165/80.4 |
| 9,713,287 B2* | 7/2017 | Wong | ................. | H05K 7/20545 |
| 2012/0037339 A1* | 2/2012 | Lipp | ................... | F28D 1/05316 |
| | | | | 165/80.2 |

FOREIGN PATENT DOCUMENTS

| | | | | |
|---|---|---|---|---|
| FR | 2682748 A1 * | 4/1993 | ................ | F28F 3/12 |
| JP | 59-015400 B | 4/1984 | | |
| JP | 2007-173578 A | 7/2007 | | |
| JP | 2011-171569 A | 9/2011 | | |

* cited by examiner

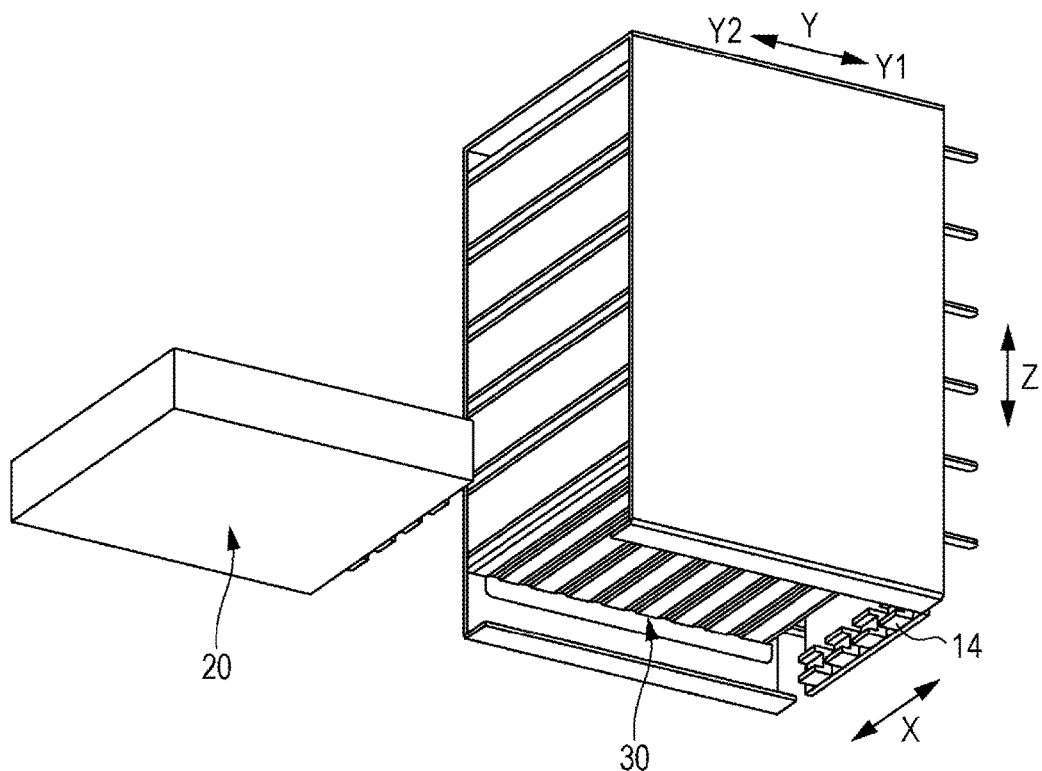

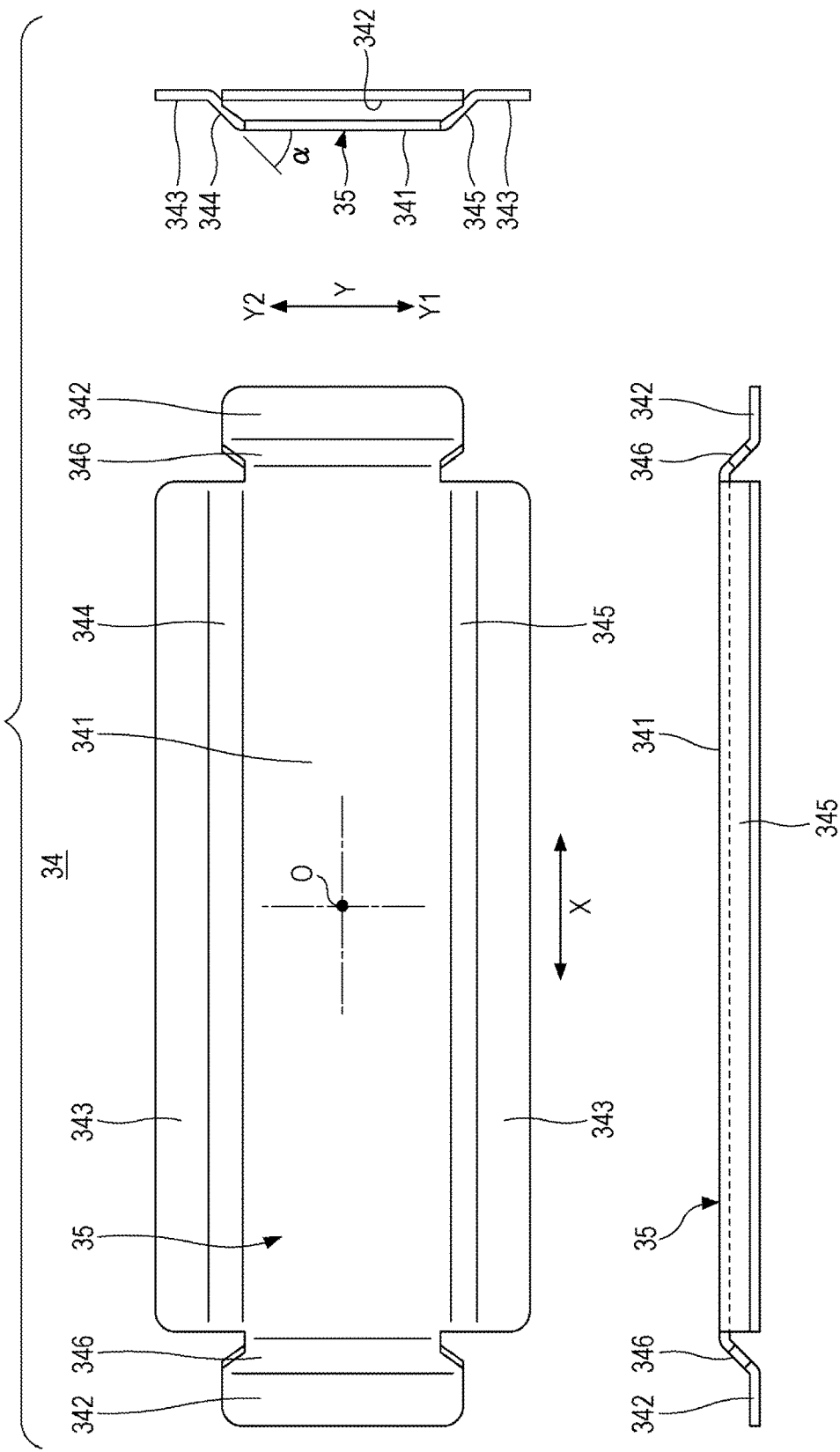

FIG. 10

| MANUFACTURER | PRODUCT NAME | MATERIAL | THERMAL CONDUCTIVITY (W/(m·K)) |
|---|---|---|---|
| TAKEUCHI INDUSTRY CO., LTD. | TMS-14 | SILICONE | 1.4 |
| TAKEUCHI INDUSTRY CO., LTD. | TMS-22 | SILICONE | 2.2 |
| SUMITOMO 3M LIMITED | 5580H | ACRYLIC | 3.0 |
| SUMITOMO 3M LIMITED | 5589H | ACRYLIC | 2.0 |
| SUMITOMO 3M LIMITED | 5578H | ACRYLIC | 3.5 |
| DENKA COMPANY LIMITED | BFG20A | SILICONE | 5.0 |
| SHIN-ETSU SILICONE | TC-BG | SILICONE | 7.3 |
| FUJI POLYMER INDUSTRIES CO., LTD. | SARCON GSR | SILICONE | 4.7 |
| FUJI POLYMER INDUSTRIES CO., LTD. | SARCON GR45A | SILICONE | 6.0 |
| TAKIRON CO., LTD. | TISU250 | URETHANE | 2.5 |

LIQUID COOLING SERVER

CROSS-REFERENCE TO RELATED APPLICATION

This application is based upon and claims the benefit of priority of the prior Japanese Patent Application No. 2016-083898, filed on Apr. 19, 2016, the entire contents of which are incorporated herein by reference.

FIELD

The embodiments discussed herein are related to a liquid cooling server that cools a heat generating component via a liquid cooling medium.

BACKGROUND

There has been known a technique in related art that a surface of a cooling chamber inside which a cooling medium circulates is pressed onto a portion to be cooled of a heat generating body by a liquid chamber to which a pressurizing fluid is introduced.

Japanese Examined Patent Application Publication No. 59-015400, Japanese Laid-open Patent Publication No. 2011-171569, and Japanese Laid-open Patent Publication No. 2007-173578 are examples of related art.

SUMMARY

According to an aspect of the invention, a liquid cooling server that cools a heat generating component via a liquid cooling medium, the liquid cooling server includes: a chassis configured to include a unit case housing portion; a unit case configured to be allowed to move in a first direction to be inserted in and pulled out from the unit case housing portion and include the heat generating component and a portion to be cooled; a cooling plate configured to be provided to the chassis, oppose the unit case housing portion in a second direction perpendicular to the first direction, and include a flow path through which the cooling medium flows; a metal portion configured to be provided to a first member which is either one of the cooling plate and the portion to be cooled, the metal portion including a plurality of first protrusions which protrude in the second direction towards a side of the unit case housing portion, the plurality of first protrusions being arranged in the first direction; and a heat transfer body configured to be provided between the metal portion and the first member in the second direction, the heat transfer body being elasticity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a perspective view from below the liquid cooling server;

FIG. 9 is a three-view drawing of a metal plate;

FIG. 10 is a diagram that illustrates examples of thermal sheets;

DESCRIPTION OF EMBODIMENTS

However, above related art has difficulty in application to a liquid cooling server in which a unit case accommodating a heat generating component is provided so as to be inserted into and pulled out the liquid cooling server. For example, a configuration including a liquid chamber to which an above pressurizing fluid is introduced is subject to inconvenience in which pressurization or depressurization work of the liquid chamber is requested at each time when the unit case is inserted or pulled out.

Therefore, there is desired a liquid cooling server having enhanced workability related to insertion and pulling out of a unit case.

Embodiments will hereinafter be described in detail with reference to drawings.

[First Embodiment]

Figure 1:
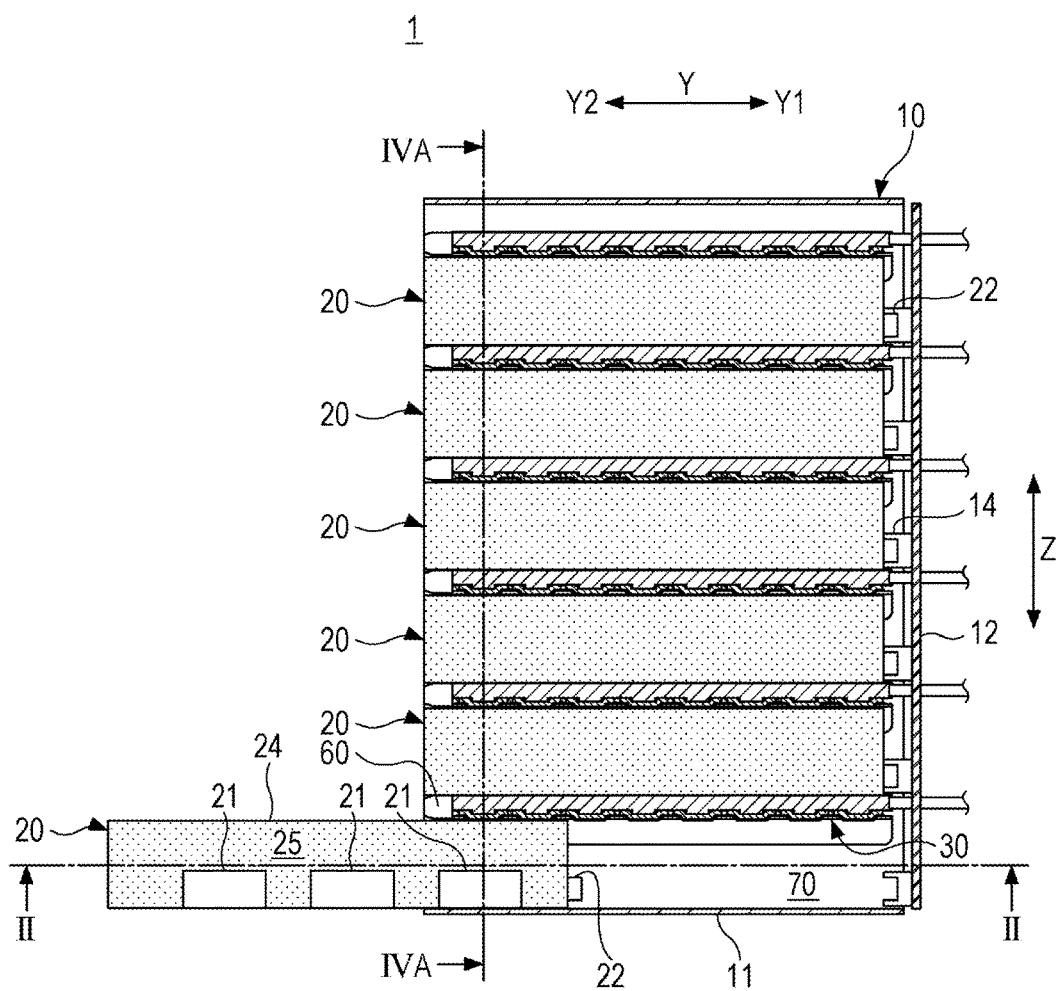
FIG. 1 is a cross-sectional view that schematically illustrates an internal structure of a liquid cooling server according to a first embodiment.
Figure 2:
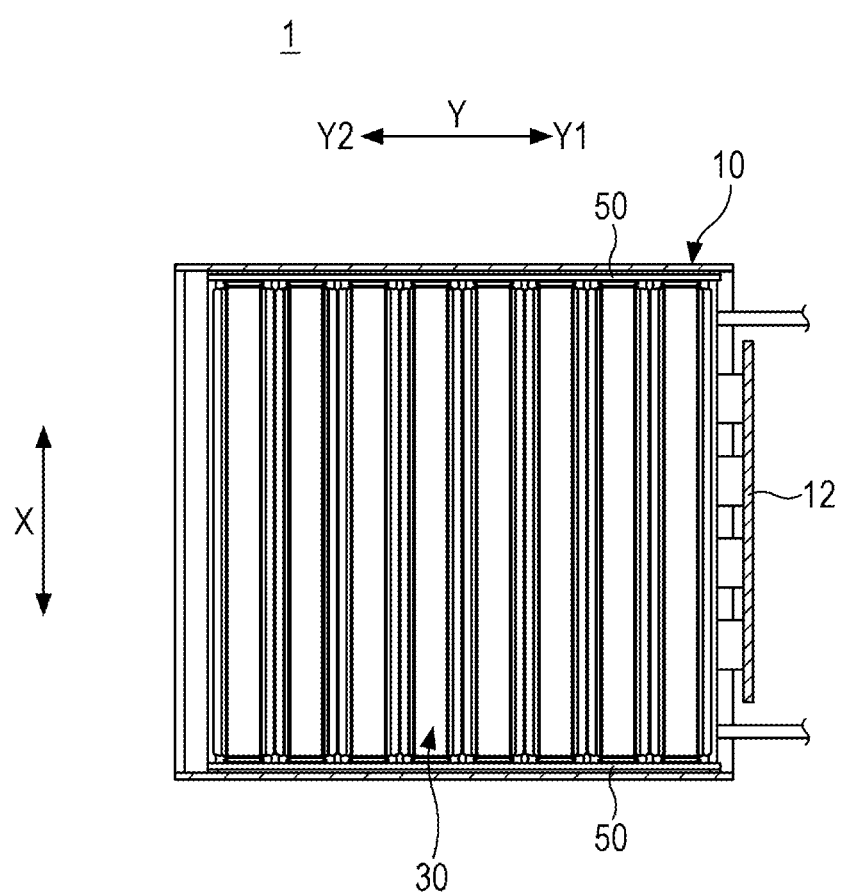
FIG. 2 is a cross-sectional view taken along line II-II in FIG. 1.

FIG. 1 is a cross-sectional view that schematically illustrates an internal structure of a liquid cooling server 1 according to a first embodiment. FIG. 2 is a cross-sectional view taken along line II-II in FIG. 1, however, a unit case 20 is not illustrated. FIG. 3 is a perspective view from below the liquid cooling server 1. FIG. 1 diagrammatically illustrates an intermediate state where the unit case 20 close to a bottom surface is inserted or pulled out. FIG. 2 does not illustrate the unit case 20 close to the bottom surface.

In the description below, three orthogonal axes of X, Y, and Z axes indicated in FIGS. 1 and 2 will appropriately be used for descriptions. The Z direction corresponds to the height direction (up-down direction) of the liquid cooling server 1. Further, in the description below, for convenience of description, while the insertion direction, toward the liquid cooling server 1, of the unit case 20 is set as a reference, Y1 side in the Y direction is set as "back side", and Y2 side of the Y direction is set as "entrance side".

The liquid cooling server 1 includes a chassis 10, the unit case 20, and a cooling module 30.

The chassis 10 forms a skeletal structure of the liquid cooling server 1 and is in a form of a rack or a shelf. The chassis 10 supports other configuration elements, such as the unit case 20 and so forth, of the liquid cooling server 1. The chassis 10 includes a unit case housing portion 70. The unit case 20 is accommodated in the unit case housing portion 70. The unit case housing portion 70 is provided in accordance with the number of unit cases 20 that are installed in the chassis 10. In the first embodiment, as illustrated in FIG. 1, as one example, six unit case housing portions 70 (that is, six decks) are formed in the Z direction. However, the number of unit case housing portions 70 is arbitrary. In a modification example, plural unit case housing portions 70 may be formed in the X direction in addition to the Z direction. In the description below, unless otherwise mentioned, as a representative case, a configuration about a pair of the unit case housing portion 70 and the unit case 20 will be described.

The unit case housing portion 70 forms a space in which the unit case 20 is accommodated. The inner space included in the unit case housing portion 70, that is, the inner space that is formed by the unit case housing portion 70 is substantially the same as the shape of the unit case 20. The dimension of the unit case housing portion 70 in the Z direction is approximately the same as the height of the unit case 20 in the Z direction. The chassis 10 may be provided with a guide member 60 on the entrance side of the unit case housing portion 70. The guide member 60 has a function of guiding the unit case 20 to an entrance of the unit case housing portion 70 in a case where the unit case 20 is inserted in the unit case housing portion 70.

The unit case 20 is provided so as to be capable of being inserted in and pulled out from the unit case housing portion 70 in the Y direction. Note that "insertion and pulling out" represent both of insertion (inserting) of the unit case 20 in the unit case housing portion 70 and pulling out of the unit case 20 from the unit case housing portion 70 without distinguishing one from another. The unit case 20 has a substantially rectangular parallelepiped external shape. However, a specific shape (the dimensions of the external shape in the X, Y, and Z directions) may be arbitrary or may be based on a standard or the like. In the description below, a state where the unit case 20 is inserted or housed in the unit case housing portion 70 will also be referred to as "housed state of the unit case 20". A state where the unit case 20 is not inserted in the unit case housing portion 70 will also be referred to as "empty state of the unit case housing portion 70".

The unit case 20 may be formed of metal such as stainless steel such as SUS430 according to Japanese Industrial Standard, for example. A heat generating component 21 diagrammatically illustrated in FIG. 1 is accommodated in the unit case 20. The heat generating component 21 is arbitrary but may be a central processing unit (CPU), large-scale integration (LSI), a power supply unit (PSU), a hard disk drive (HDD), or the like. A connector 22 may be provided on a back side of the unit case 20. The connector 22 is fitted in a connector 14 on a back board 12 that is provided on the back side of the chassis 10, for example. The connector 22 has a function of electrically coupling an electronic circuit and the heat generating component 21 in the unit case 20 with the back board 12, for example.

The unit case 20 includes a portion to be cooled 24. The portion to be cooled 24 may be the heat generating component 21 itself or one formed on the unit case 20. The portion to be cooled 24 may be a member which is formed with a member that is attached to or accommodated in the unit case 20 and is thermally coupled with the heat generating component 21. The portion to be cooled 24 is preferably set in a spot in which a relatively wide area may be secured. For example, the portion to be cooled 24 is preferably set on an upper surface side or a lower surface side of the unit case 20 on which a wider area than side surface of the unit case 20 may be secured, where the side surface is, for example, the side surface in the X direction of the unit case 20. In the first embodiment, as illustrated in FIG. 1, as one example, the portion to be cooled 24 is formed with a member (a sheet metal member, for example) of the upper surface of the unit case 20. The portion to be cooled 24 extends in the X-Y plane. The portion to be cooled 24 is a substantially flat surface but may include uneven portions such as an opening and an irregularity. The portion to be cooled 24 may be formed in a portion of the upper surface of the unit case 20 but is preferably formed of the substantially whole upper surface of the unit case 20 in order to enhance heat dissipation of the unit case 20.

In the first embodiment, as one example, thermal grease 25 such as heat dissipation grease is filled in an internal portion of the unit case 20. The thermal grease 25 contains particles with high thermal conduction, for example. The thermal grease 25 reduces the thermal resistance between the heat generating component 21 and the portion to be cooled 24 in the unit case 20. Accordingly, the thermal grease 25 is preferable in a case where the heat generating component 21 is not contacting with the portion to be cooled 24 (see FIG. 1, for example).

The cooling module 30 is provided in the chassis 10. The cooling module 30 is preferably provided for each of the unit case housing portions 70. In the first embodiment, as one example, one cooling module 30 is provided for each of the unit case housing portions 70. However, two or more cooling modules 30 may be provided for each of the unit case housing portions 70. In the description below, unless otherwise mentioned, as a representative case, a configuration about one cooling module 30 will be described.

Next, a structure of the cooling module 30 will be described with reference to FIGS. 4A to 8.

Figure 4A:
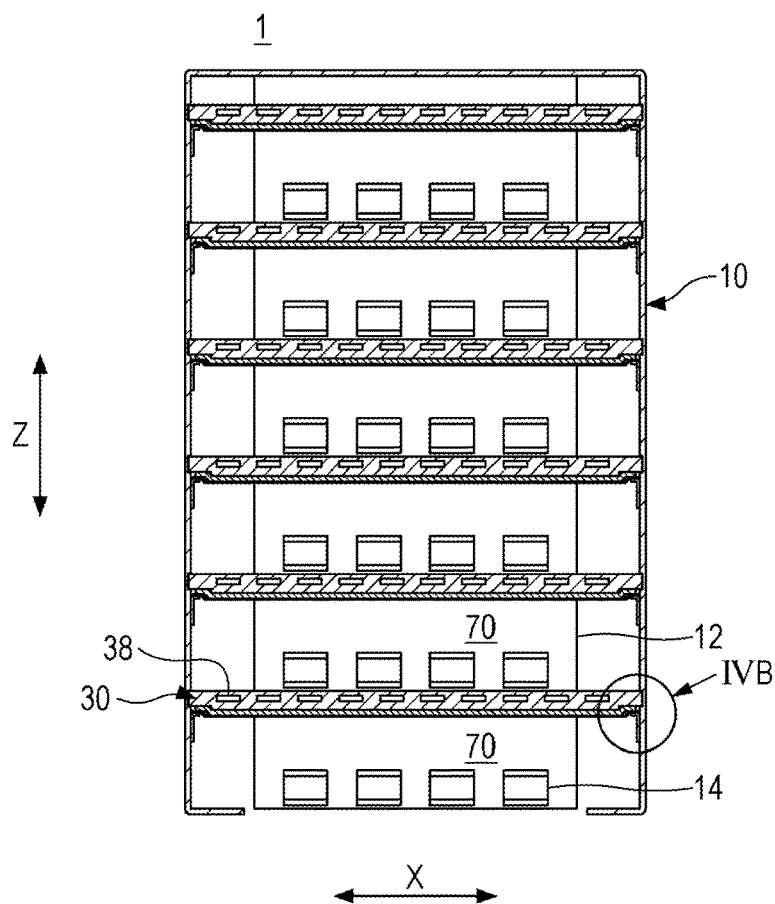
FIG. 4A is a cross-sectional view of a chassis in a state where the unit case is not housed.
Figure 4B:
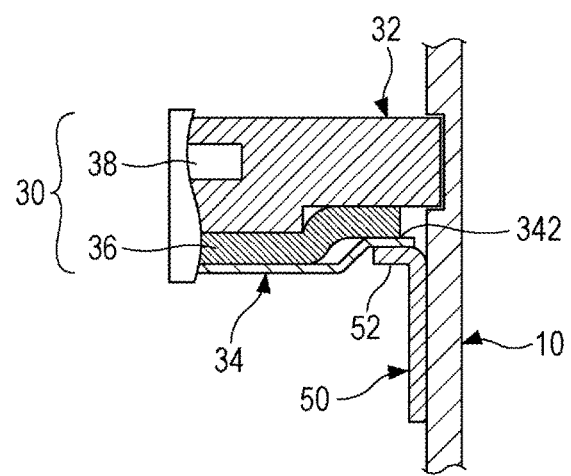
FIG. 4B is an enlarged view of IVB part in FIG. 4A.
Figure 5:
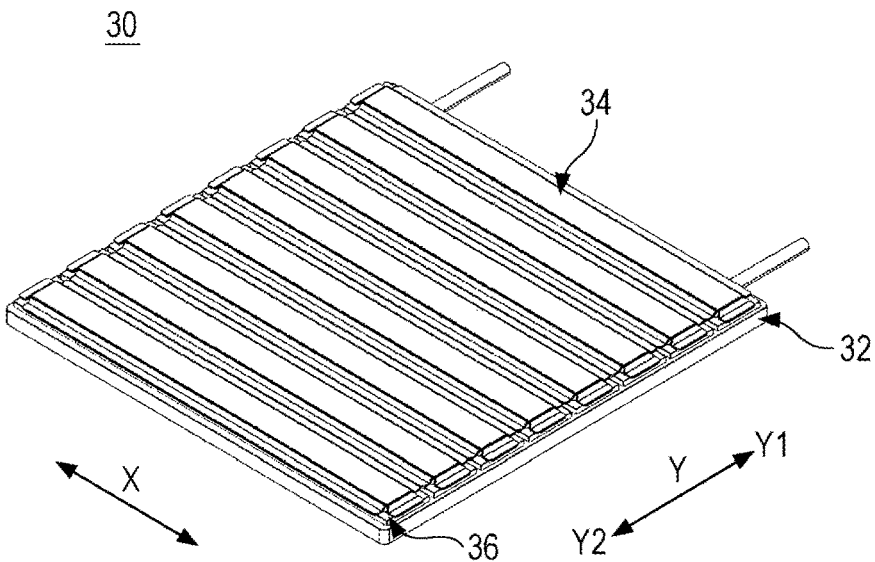
FIG. 5 is a perspective view of a cooling module alone as seen from below.
Figure 6:
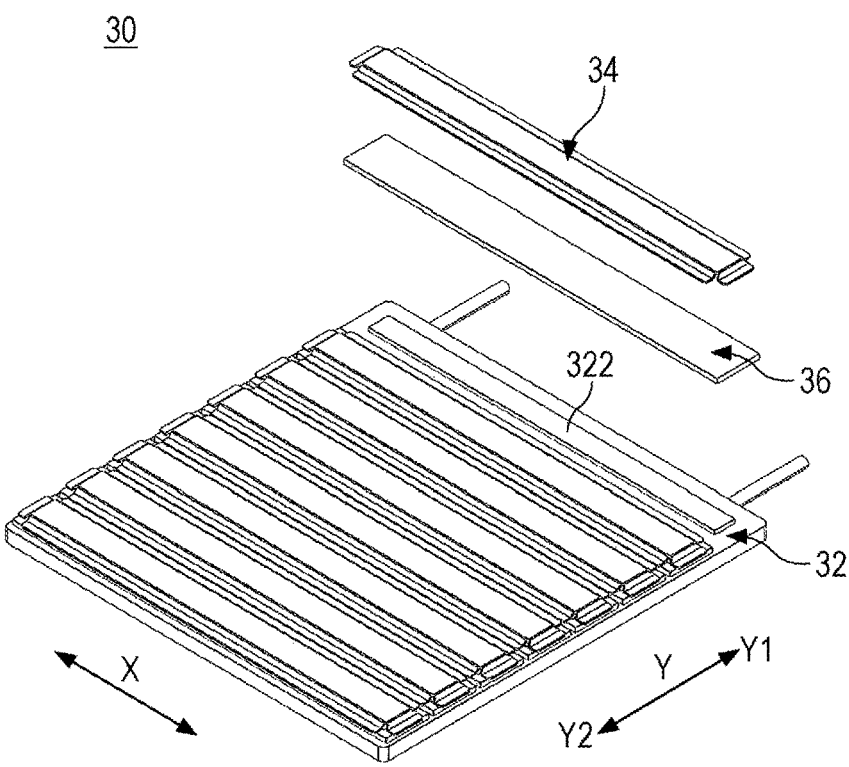
FIG. 6 is an exploded perspective view of the cooling module as seen from below.
Figure 7:
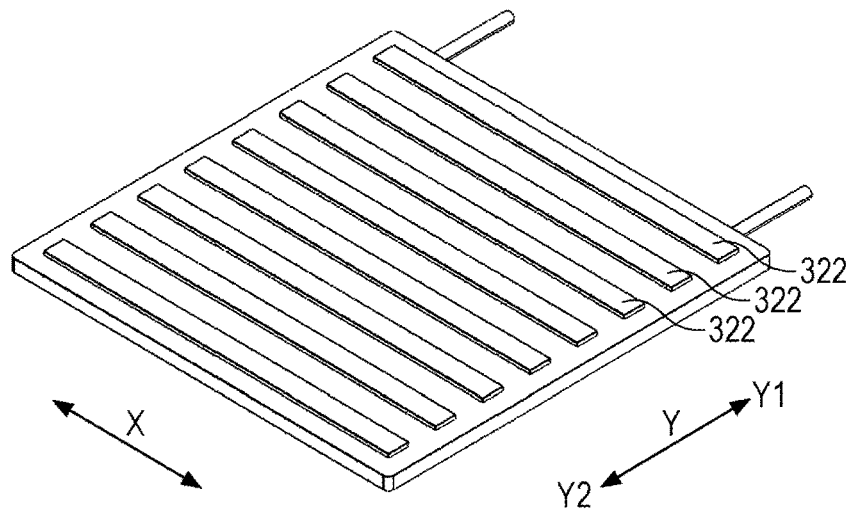
FIG. 7 is a perspective view of a cooling plate alone as seen from below.
Figure 8:
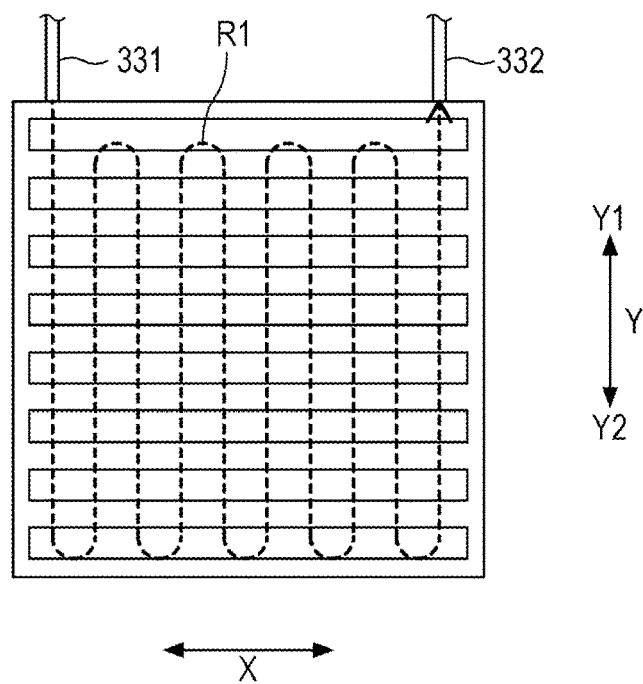
FIG. 8 is an explanatory view of a flow path of the cooling plate.

FIG. 4A is a cross-sectional view of the chassis 10 and corresponds to a cross-sectional view taken along line IVA-IVA in FIG. 1. FIG. 4A is the cross-sectional view in a state where the unit case 20 is not housed. FIG. 4B is an enlarged view of IVB part in FIG. 4A. FIG. 5 is a perspective view of the cooling module 30 alone as seen from below, and FIG. 6 is an exploded perspective view of the cooling module 30 as seen from below. FIG. 7 is a perspective view of a cooling plate 32 alone as seen from below, and FIG. 8 is an explanatory view of a flow path 38 of the cooling plate 32 and is a plan view that illustrates a lower side surface of the cooling plate 32. FIG. 9 is a three-view drawing of a metal plate 34.

The cooling plate 32 is fixed to the chassis 10. The cooling plate 32 may be fixed to the chassis 10 by a fastening tool such as a screw or a bolt, for example, or may be fixed to the chassis 10 by a fitting structure (see FIG. 4B). The cooling plate 32 may be formed of a material with high heat conductivity and may be formed of oxygen-free copper such as C10200 according to industry standards, for example. As illustrated in FIG. 4A, the cooling plate 32 includes the flow path 38, through which a liquid cooling medium (cooling water) flows, in an internal portion. FIG. 8 diagrammatically illustrates flow direction R1 (broken line) of the cooling medium in the cooling plate 32. In the example illustrated in FIG. 8, a supply pipe 331 is connected to a back side and a portion around one end side in the X direction of the cooling plate 32. An outlet pipe 332 is connected to the back side and a portion around the other end side in the X direction of the cooling plate 32. The flow path 38 in the cooling plate 32 is formed in a manner such that the flow path 38 reciprocates in the Y direction while moving in the X direction, between the supply pipe 331 and the outlet pipe 332. In a modification example, in the cooling plate 32, plural flow paths that allow the cooling medium to flow in the X direction may be formed in parallel in the Y direction.

The cooling plate 32 is opposed to the unit case housing portion 70 in the Z direction. The range, as a range in the X-Y plane, in which the cooling plate 32 is opposed to the unit case housing portion 70 is arbitrary but is preferably a range that may cover the whole portion to be cooled 24 of the unit case 20 in the housed state for enhancing the cooling ability. That is, in view of enhancing the cooling ability, the cooling plate 32 preferably extends in the X direction and the Y direction throughout the whole lengths in the X direction and the Y direction of the portion to be cooled 24 of the unit case 20 in the housed state.

In the first embodiment, as illustrated in FIG. 2 and so forth, as one example, the cooling plate 32 is opposed to the unit case housing portion 70 from above in the Z direction. That is, a lower side surface of the cooling plate 32 is opposed to the upper surface of the unit case 20 in the Z direction. However, in a modification example, the cooling plate 32 may be opposed to the unit case housing portion 70 from below in the Z direction or may be opposed to the unit case housing portion 70 on both of upper and lower sides.

As illustrated in FIG. 7 and so forth, the cooling plate 32 includes plural protrusions 322, as one example of a second protrusion, on a surface on the side that is opposed to the unit case housing portion 70, where the surface is the lower surface of the cooling plate 32 in the first embodiment, as described above. Each of the plural protrusions 322 is formed in a protruding shape that protrudes on the lower side or on the unit case 20 side. The plural protrusions 322 are formed in a manner such that those are aligned in the Y direction and protrude downward on the lower side surface of the cooling plate 32. Each of the plural protrusions 322 is provided with the metal plate 34. Each of the plural protrusions 322 is formed in a protruding shape that corresponds to a protrusion 35 (described later) of the corresponding metal plate 34. Intervals among the plural protrusions 322 in the Y direction are arbitrary but are decided such that the plural metal plates 34 may be aligned in the Y direction so as not to overlap with each other. The plural protrusions 322 are mutually in the same form but may partially be different in the length, width, and so forth. The plural protrusions 322 are solid. However, a flow path and so forth may be formed. The plural metal plates 34 may have the same shape and so forth. In the description below, unless otherwise mentioned, "metal plate 34" indicates one arbitrary metal plate 34 among the plural metal plates 34.

The metal plate 34 is provided on the cooling plate 32. As described later, the metal plate 34 contacts with the portion to be cooled 24 of the unit case 20 in the housed state (see FIG. 11) and has a function, such as a heat transfer function, of transferring heat from the unit case 20 to the cooling plate 32 via the heat transfer body 36. Further, as described later, the metal plate 34 has a function of facilitating insertion and pulling out of the unit case 20 (insertion and pulling out facilitation function). Further, as described later, the metal plate 34 serves as a sliding portion in a case where the unit case 20 is inserted or pulled out and has a function of enhancing durability against friction between the cooling module 30 and the unit case 20 (durability improvement function).

As illustrated in FIG. 5 and so forth, the plural metal plates 34 are provided on a surface of the cooling plate 32 on the side that is opposed to the unit case housing portion 70 (in the first embodiment, as described above, on the lower side surface as one example). The plural metal plates 34 are aligned in the Y direction. The plural metal plates 34 do not overlap with each other. Intervals of the plural metal plates 34 in the Y direction are arbitrary but are preferably approximately zero so as to be densely aligned in the Y direction for enhancing the above heat transfer function.

The metal plate 34 is formed of sheet metal, for example. The sheet metal is aluminum sheet metal to which a hard anodic oxide coating treatment is applied, for example. As illustrated in FIG. 9, the metal plate 34 includes the protrusion 35, as one example of a first protrusion, that protrudes on the lower side (on the unit case 20 side). Accordingly, the plural metal plates 34 are aligned in the Y direction, and the plural protrusions 35 are thereby aligned along the Y direction. The number of protrusions 35 for one metal plate 34 is arbitrary. In the first embodiment, the number is one as one example.

The protrusions 35 of the plural metal plates 34 respectively make pairs with the plural protrusion 322 of the cooling plate 32. Each of the plural metal plates 34 is provided for the protrusion 322 of the cooling plate 32 in a manner such that the protrusion 35 covers the corresponding protrusion 322 of the cooling plate 32. As described later, in the first embodiment, as one example, one heat transfer body 36 is provided between each of the protrusions 35 of the plural metal plates 34 and the corresponding protrusion 322 in the Z direction.

In the example illustrated in FIG. 9, the metal plate 34 includes end portions 342 on both sides in the X direction and end portions 343 on both sides in the Y direction. When the module 30 is provided in the chassis 10, the protrusion 35 protrudes downward with respect to the end portions 342 and the end portions 343. The end portions 342 and the end portions 343 extend in the same plane (the X-Y plane), for example. The protrusion 35 includes an abutting surface 341 that abuts the portion to be cooled 24 of the unit case 20 in the housed state, side surfaces 344 and 345 in the Y direction, and side surfaces 346 in the X direction. In the example illustrated in FIG. 9, the metal plate 34 is symmetrical with respect to diagram center O but may be asymmetrical.

The metal plate 34 extends in the X direction. The length of the metal plate 34 in the X direction is arbitrary. However, the length of the metal plate 34 in the X direction is longer than the length in the Y direction. The length of the metal plate 34 in the X direction is preferably substantially the same as the length of the portion to be cooled 24 in the X direction in view of enhancing the above heat transfer function. The protrusion 35 preferably extends throughout the substantially whole length of the metal plate 34 in the X direction in view of enhancing the above heat transfer function. However, the plural metal plates 34 may be provided in a manner such that those are successively provided in the X direction throughout the whole length in the X direction of the portion to be cooled 24 of the unit case 20 in the housed state.

The metal plate 34 is displaceable in the Z direction with respect to the cooling plate 32. For example, the metal plate 34 may be supported by the cooling plate 32 so as to be displaceable in the Z direction with respect to the cooling plate 32 or may be supported by the chassis 10 so as to be displaceable in the Z direction with respect to the cooling plate 32. A supporting method of the metal plate 34 is arbitrary as long as the metal plate 34 is displaceable in the Z direction with respect to the cooling plate 32. In the example illustrated in FIGS. 4A and 4B, the metal plate 34 is supported by a support member 50 so as to be displaceable in the Z direction in each of the end portions 342 on both sides in the X direction. The support member 50 is fixed to the chassis 10. Each of the support members 50 extends in the Y direction and simultaneously supports the plural metal plates 34 that are aligned in the Y direction. As illustrated in FIG. 4B, each of the support members 50 includes a pressing portion 52 that extends in the X direction, and the pressing portion 52 abuts a lower surface of the corresponding end portion 342 of the metal plate 34 in the Z direction. The pressing portion 52 specifies a limit position of the downward displacement of the metal plate 34. The limit position of the upward displacement of the metal plate 34 is decided in accordance with a crush (compression) limit of the heat transfer body 36.

The metal plate 34 is preferably displaced upward (in the direction to approach the cooling plate 32 in the Z direction) due to insertion of the unit case 20 in the unit case housing portion 70 in view of the above heat transfer function. In this case, although described later, the heat transfer efficiency via the heat transfer body 36 is enhanced. For this purpose, the cooling module 30 is arranged in the chassis 10 such that a lower end portion (top portion) of the protrusion 35 is positioned in the unit case housing portion 70 (see region T1 in FIG. 11) in the empty state of the unit case housing portion 70. The length of the protrusion 35 in the Z direction of the portion that is positioned in the unit case housing portion 70 is set such that the heat transfer body 36 is crushed in a desired manner in a state where the unit case 20 is housed in the unit case housing portion 70 (see region T2 in FIG. 11).

As illustrated in FIG. 9, the protrusion 35 of the metal plate 34 preferably includes the inclined side surface 344 on the entrance side in the Y direction in view of the above insertion and pulling out facilitation function. That is, the width of the protrusion 35 in the Y direction narrows toward the top portion side of the protruding shape in the Z direction due to the side surface 344 on the entrance side in the Y direction. The side surface 344 is inclined in a direction in which a lower side (the top portion side of the protrusion 35) is closer to the back side in the Y direction (Y1 side) than an upper side (a bottom side of the protrusion 35). An angle α that is formed by the side surface 344 and the X-Y plane is in a range of 20 to 70 degrees, for example, is preferably in a range of 30 to 60 degrees, is further preferably in a range of 40 to 50 degrees, and is approximately 45 degrees, for example. Accordingly, the protrusion 35 is pushed in an obliquely upward direction (the direction toward the back side) by the unit case 20 in a case of insertion. In a case where the protrusion 35 is pushed in the obliquely upward direction from the unit case 20, the metal plate 34 is displaced upward. As a result, the metal plate 34 withdraws upward from the unit case housing portion 70, thereby facilitating insertion of the unit case 20 (described later with reference to FIG. 11).

In the example illustrated in FIG. 9, the protrusion 35 of the metal plate 34 forms a trapezoidal space therein, in which the lower base is shorter than the upper base when seen in the X direction. In a modification example, in the protrusion 35, the side surface 345 on Y1 side in the Y direction and/or the end portion 343 may be perpendicular to the abutting surface 341. In this case, the area of the abutting surface 341 may efficiently be increased. Further, in another modification example, although the side surface 344 is perpendicular to the abutting surface 341, a comparatively large corner radius may be given to a joining portion or a corner between the side surface 344 and the abutting surface 341. In a case where the metal plate 34 is shaped from sheet metal, the corner radius is inevitably formed.

The plural heat transfer bodies 36 are provided between the cooling plate 32 and the plural metal plates 34 in the Z direction. The plural heat transfer bodies 36 respectively make groups with the plural metal plates 34 and the plural protrusions 322 of the cooling plate 32. Accordingly, the plural heat transfer bodies 36 are arranged in a manner such that those are aligned in the Y direction similarly to the plural metal plates 34 and the plural protrusions 322 (see FIG. 11). Each of the plural heat transfer bodies 36 is provided in a manner such that it covers the corresponding protrusion 322. The plural heat transfer bodies 36 have elasticity. The elasticity of the heat transfer body 36 preferably has restorability that allows the heat transfer body 36 to endure repetition of insertion and pulling out of the unit case 20. The plural heat transfer bodies 36 are arranged separately from each other in the Y direction in the empty state of the unit case housing portion 70 so as to be capable of elastic deformation in a case of receiving a pressure in the Z direction (because spaces which the heat transfer bodies 36 enter when those are crushed are requested). That is, the thickness in the Z direction and the width in the Y direction of each of the plural heat transfer bodies 36 are set such that the thermal conduction of the heat transfer body 36 in the housed state of the unit case 20 becomes optimal. The length of each of the plural heat transfer bodies 36 in the X direction is arbitrary but may be substantially the same as the length of the metal plate 34 in the X direction.

In the first embodiment, as one example, the heat transfer body 36 is formed in a flat sheet shape. The heat transfer body 36 may be formed of a thermal sheet, a thermal interface material (TIM), or kinds of materials that are similar to those. As the thermal sheet, various kinds of thermal sheets that are indicated in FIG. 10 may be used, for example.

The heat transfer body 36 may be elastically deformed in the empty state of the unit case housing portion 70. That is, the position of the pressing portion 52 of the support member 50 is appropriately set, and the heat transfer body 36 may thereby be slightly elastically deformed in the empty state of the unit case housing portion 70, for example. In this case, there is prevented a position offset of heat transfer body 36 which may occur when the unit case housing portion 70 is the empty state and the heat transfer body 36 is not elastically deformed, the heat transfer body 36 may hold a normal position. In the first embodiment, the heat transfer body 36 receives an upward pressure in the Z direction via the metal plate 34 and elastically deforms into a protruding shape extending to a lower side in a space between the protrusion 35 and the protrusion 322 as seen in the X direction (see FIG. 11). That is, the heat transfer body 36 elastically deforms into a protruding shape that fits in the protrusion 35.

Next, a description will be made with reference to FIG. 11 about a configuration of the cooling module 30 from the viewpoint of insertion and extraction of the unit case 20 to/out the unit case housing portion 70.

Figure 11:
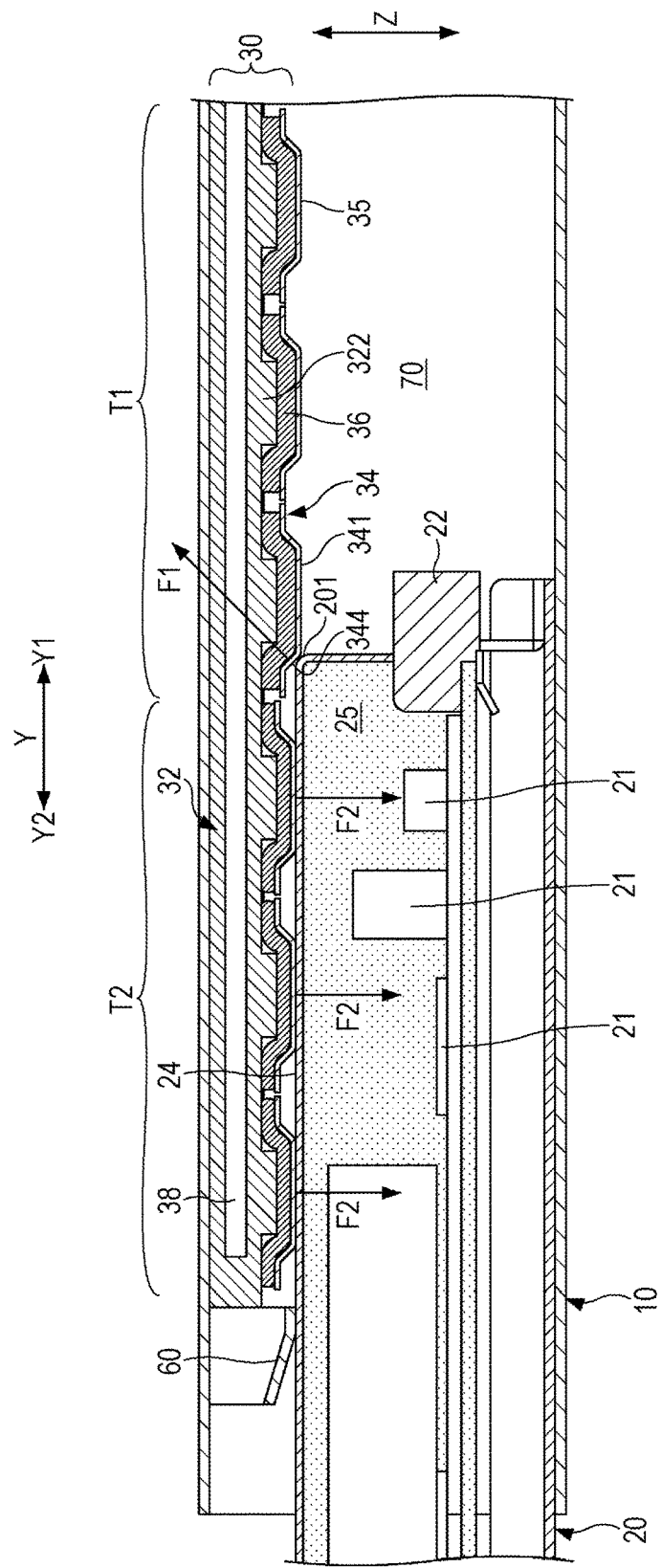
FIG. 11 is a cross-sectional view that illustrates an intermediate state where the unit case is inserted in a unit case housing portion.

FIG. 11 is a cross-sectional view that illustrates an intermediate state where the unit case 20 is inserted in the unit case housing portion 70. FIG. 11 illustrates one example of a cross section of the unit case 20 more specifically than FIG. 1. As illustrated in FIG. 11, the unit case 20 includes a corner portion 201 having a comparatively large corner radius on an upper side of an end portion on the back side in the Y direction so as to facilitate insertion of the unit case 20 into the unit case housing portion 70.

As described above, as illustrated in region T1 in FIG. 11, in the empty state of the unit case housing portion 70, the lower end portion (top portion) of the protrusion 35 is positioned slightly inside the unit case housing portion 70. Accordingly, when the unit case 20 is inserted, the corner portion 201 of the unit case 20 abuts the side surface 344. In a case where the unit case 20 is further pushed into the back side in the Y direction in a state where the corner portion 201 of the unit case 20 abuts the side surface 344, as illustrated in FIG. 11, the protrusion 35 is pushed in an obliquely upward direction from the unit case 20 (see force F1). In a case where the protrusion 35 is pushed in the obliquely upward direction from the unit case 20, the metal plate 34 of the protrusion 35 is displaced upward. Even when the metal plate 34 receives force F1, the metal plate 34 substantially does not deform but is displaced upward. In such a way, the unit case 20 causes the plural metal plates 34 aligned in the Y direction to sequentially withdraw upward with moving of the unit case 20 from the entrance side in the Y direction. Thereby the unit case 20 slides on the abutting surfaces 341 of the protrusions 35 of the withdrawn metal plates 34 and may move toward the back side in the Y direction. As described above, because the protrusion 35 of the metal plate 34 includes the inclined side surface 344, the unit case 20 may smoothly be inserted in a manner such that unevenness is reduced. As described above, in the first embodiment, insertion of the unit case 20 in the unit case housing portion 70 is easy. Further, in the first embodiment, because the protrusions 35 withdraw upward in response to insertion of the unit case 20 in the unit case housing portion 70, preparatory work or work prior to insertion for causing the protrusions 35 to withdraw upward is not requested. The preparatory work for causing the protrusions 35 to withdraw upward is not requested similarly in a case where the unit case 20 is pulled out from the unit case housing portion 70. Accordingly, in the first embodiment, compared to a case where the preparatory work is requested, workability in insertion and pulling out of the unit case 20 may be improved.

In a case where the unit case 20 is inserted in the unit case housing portion 70, the portion to be cooled 24 of the unit case 20 abuts the protrusions 35 of the metal plates 34 in the Z direction. Although a state where the unit case 20 is entirely housed in the unit case housing portion 70 is not illustrated, the relationship in such a state between the cooling module 30 and the unit case 20 is equivalent to a state illustrated in region T2 in FIG. 11. As illustrated in region T2 in FIG. 11, in the housed state of the unit case 20, the metal plates 34 and the protrusions 35 together therewith are displaced upward compared to a state at a time before insertion (see region T1 in FIG. 11). That is, as described above, the metal plates 34 and the protrusions 35 together therewith are displaced upward in response to insertion of the unit case 20 in the unit case housing portion 70. In a case where the metal plates 34 and the protrusions 35 together therewith are displaced upward, the heat transfer bodies 36 are crushed (elastically deformed) in the Z direction. That is, because the cooling plate 32 is not displaced, upward displacements of the metal plates 34 are absorbed (accepted) by the elastic deformation of the heat transfer bodies 36. In a case of elastically deforming, the heat transfer body 36 becomes the protruding shape between the protrusion 35 and the protrusion 322 and at least partially fills the space between the neighboring heat transfer bodies 36 in the Y direction and the space between the heat transfer body 36 and the protrusion 322 of the cooling plate 32. Accordingly, the contact area among the heat transfer body 36, the cooling plate 32, and the metal plate 34 increases, and the heat transfer performance is thereby enhanced.

Further, as illustrated in region T2 in FIG. 11, in the housed state of the unit case 20, the protrusions 35 of the metal plates 34 apply forces F2 in the Z direction to the portion to be cooled 24 of the unit case 20. Force F2 is mainly due to a repulsion force of the heat transfer body 36 that is elastically deformed. In other words, the protrusion 35 of the metal plate 34 receives the force in the opposite direction with the same magnitude as force F2 due to reaction from the unit case 20, and this force maintains the heat transfer body 36 in an elastically deformed state. Accordingly, in the housed state of the unit case 20, due to forces F2 in the Z direction, the contact between the abutting surfaces 341 of the protrusions 35 of the metal plates 34 and the portion to be cooled 24 of the unit case 20 is stabilized. Accordingly, the heat transfer function of the metal plates 34 is enhanced, and the cooling ability by the cooling module 30 for cooling the unit case 20 via the portion to be cooled 24 may thereby be improved.

As described above, in the first embodiment, in the liquid cooling server 1, while the cooling ability that is requested in the housed state of the unit case 20 is secured, workability in insertion and pulling out of the unit case 20 may be enhanced.

Further, in the first embodiment, the plural metal plates 34 are displaceable in the Z direction independently from each other. Thus, as the unit case 20 moves toward the back side when the unit case 20 is inserted, the plural metal plates 34 are caused to sequentially withdraw upward from the entrance side in the Y direction. That is, insertion of the unit case 20 is not hindered by the plural metal plates 34. This results in proper workability in insertion of the unit case 20.

Incidentally, in the first embodiment, the cooling plate 32 includes the protrusions 322. However, in a case where the cooling plate 32 does not include the protrusions 322, hereinafter, this modification example will be referred to as "first modification example", the following inconvenience occurs. In a case of the first modification example, in a case where the heat transfer body 36 is formed in a flat sheet shape, the elastic deformation amount of the heat transfer body 36 may be insufficient in the housed state of the unit case 20. For example, in the first modification example, in the housed state of the unit case 20, the heat transfer body 36 does not elastically deform into the protruding shape between the protrusion 35 and the protrusion 322. Thus, the contact area among the heat transfer body 36, the cooling plate 32, and the metal plate 34 may be insufficient. Further, in the first modification example, forces F2 are insufficient in the housed state of the unit case 20. Thus, the stability of the contact between the abutting surfaces 341 of the protrusions 35 of the metal plates 34 and the portion to be cooled 24 of the unit case 20 may be insufficient. In this point, in the first embodiment, because the cooling plate 32 includes the protrusions 322 as described above, the inconvenience in the above-described first modification example may be reduced. In the first modification example also, instead of the heat transfer body 36 that is formed in the flat sheet shape, it is possible to reduce the above inconvenience by using a heat transfer body that has a protrusion which fills the space between the protrusion 35 and the cooling plate 32 in the empty state of the unit case housing portion 70.

Incidentally, the distance in the Z direction between the portion to be cooled 24 of the unit case 20 and the cooling module 30 may vary among positions of the portion to be cooled 24 of the unit case 20 along the Y direction due to a component tolerance, an assembly tolerance, or the like. In this case, in a case where the plural metal plates 34 are coupled with each other in the Y direction or a case where, instead of the plural metal plates 34, the length of the abutting surface 341 of the protrusion 35 of one metal plate 34 in the Y direction is elongated, hereinafter, those modifications will be referred to as "second modification", the following inconvenience occurs. In the second modification example, in the housed state of the unit case 20, the stability of the contact in the Z direction between the portion to be cooled 24 of the unit case 20 and the metal plate may become unstable. That is, in a case where the distance in the Z direction between the portion to be cooled 24 of the unit case 20 and the cooling module is different among positions along the Y direction, in the second modification example, the contact in the Z direction between the portion to be cooled 24 of the unit case 20 and the metal plate may be realized only in a portion along the Y direction. The portion along the Y direction is a portion in which the distance in the Z direction between the portion to be cooled 24 of the unit case 20 and the cooling module is comparatively short.

On the other hand, in the first embodiment, as described above, the plural metal plates 34 do not overlap with each other. Accordingly, the plural metal plates 34 are displaceable in the Z direction independently from each other. The plural metal plates 34 aligned in the Y direction are displaceable in the Z direction independently from each other. Thus, the inconvenience in the above-described second modification example may be reduced. That is, even in a case where the distance in the Z direction between the portion to be cooled 24 of the unit case 20 and the cooling module is different among positions along the Y direction, in the first embodiment, the metal plates 34 in the respective positions along the Y direction may be displaced upward independently from each other in accordance with the distance in the Z direction in the respective positions along the Y direction. As a result, in the first embodiment, even in a case where the distance in the Z direction between the portion to be cooled 24 of the unit case 20 and the cooling module 30 is different among positions along the Y direction, the contact between the metal plates 34 and the portion to be cooled 24 of the unit case 20 may be stabilized in a whole range in the Y direction. Here, "follow-up function" will be defined as following; the follow-up function is a function which is capable of stabilizing the contact between the metal plates 34 and the portion to be cooled 24 of the unit case 20 even in a case where the distance in the Z direction between the portion to be cooled 24 of the unit case 20 and the cooling module is different among positions along the Y direction.

As for pitches in the Y direction of the plural protrusions 35 that are formed by the plural metal plates 34 aligned in the Y direction, the above-described follow-up function is more enhanced as the pitches become shorter. Meanwhile, as the pitches are shorter, the non-contact range in the Y direction between the portion to be cooled 24 of the unit case 20 and the cooling module 30 becomes wider. The non-contact range between the portion to be cooled 24 of the unit case 20 and the cooling module 30 occurs in ranges of the side surfaces 344 and 345 of the protrusions 35 of the metal plates 34 in the Y direction and the end portions 343 of the metal plates 34 on both sides in the Y direction. Accordingly, the pitch may be adapted in consideration of those trade-offs. For example, in a case where the ratio of the total area S1 of all the abutting surfaces 341 of the plural metal plates 34 to an area S0 of the portion to be cooled 24 of the unit case 20 is set as an index, where the ration is S1/S0, the pitch is set such that the ratio becomes 0.4 or more and is set such that the ratio becomes approximately 0.5, for example.

Further, in the first embodiment, because the thermal grease 25 is filled in the unit case 20, the heat of the heat generating components 21 is transferred to the whole portion to be cooled 24 of the unit case 20 via the thermal grease 25. Accordingly, the area of the portion to be cooled 24 is set wide compared to the area of the heat generating components 21, and the heat transmitted from the heat generating components 21 may thereby be transferred to the portion to be cooled 24 while being dispersed. As a result, the heat generating components 21 may efficiently cooled via the portion to be cooled 24. However, in a modification example, the thermal grease 25 may be omitted. In this case, the unit case 20 may be brought into contact with a heat sink (not illustrated) that is thermally coupled with the heat generating components 21.

Figure 12:
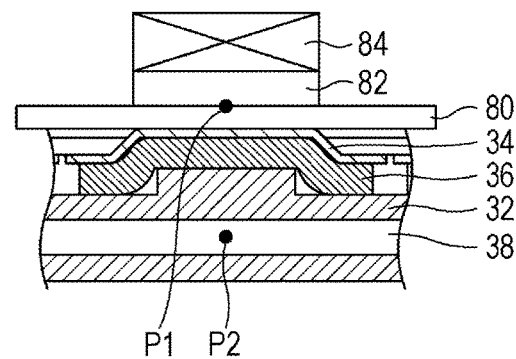
FIG. 12 is an explanatory view of a configuration in an experiment.

Next, a description will be made about results of an experiment that was performed by the inventor of the present application with reference to FIG. 12. FIG. 12 is an explanatory view of a configuration in the experiment and corresponds to a cross-sectional view as seen in the X direction.

As illustrated in FIG. 12, in the experiment, one group of the protrusion 322 of the cooling plate 32, the metal plate 34, and the heat transfer body 36 was focused. A heater 84 that corresponded to the heat generating component 21 was mounted on a member 80 that corresponded to the unit case 20 via a thermal sheet 82. Properties of the components are indicated in table 1. Further, as the heat transfer body 36, a thermal sheet with a thickness of 2 mm which was the same as the thermal sheet 82 was used. The contact surface of the metal plate 34 (the area of the abutting surface 341) was 400 mm$^2$, and the thickness of the thermal sheet of the heat transfer body 36 was compressed by 25%. Further, the member 80 was formed of SUS430 with a thickness of 1 mm, and the metal plate 34 was formed of aluminum A5052 according Japanese Industrial Standard which was subjected to the hard anodic oxide coating treatment and was a thickness of 0.5 mm. Further, the cooling plate 32 was formed of the oxygen-free copper, and the height of the protrusion 322 was set to 4 mm.

TABLE 1

| Material (component) | Thermal resistance (° C./W) | Thermal conductivity (W/(m · K)) |
|---|---|---|
| Thermal sheet | 0.05 | 20.0 |
| Metal plate 34 | 0.007 | 138 |
| Cooling plate | 0.0026 | 391 |
| Unit case (member 80) | 0.038 | 26 |
| Whole configuration | 1.5 | 0.667 |

As for the whole configuration in the laminated arrangement form, the thermal resistances of respective contact surfaces between the materials are added to the thermal resistances of the individual materials in the whole configuration. In the experiment, the thermal resistance between points P1 and P2 was calculated by temperature measurement, and the thermal resistance value of the whole configuration was 1.5° C./W. This value indicates that cooling by 40 W is possible for one metal plate 34 in a case where it is assumed that the allowance value of the surface temperature rise of the unit case 20 is 60° C. In order to handle higher heat generation, the area of the portion to be cooled 24 of the unit case 20 is increased, and the plural metal plates 34 are used. For example, the cooling by 120 W is possible by three metal plates and a contact surface of 1200 mm².

Next, a description will be made about one example of a liquid cooling system that includes the liquid cooling server 1 according to the first embodiment with reference to FIG. 13 and so forth.

Figure 13:
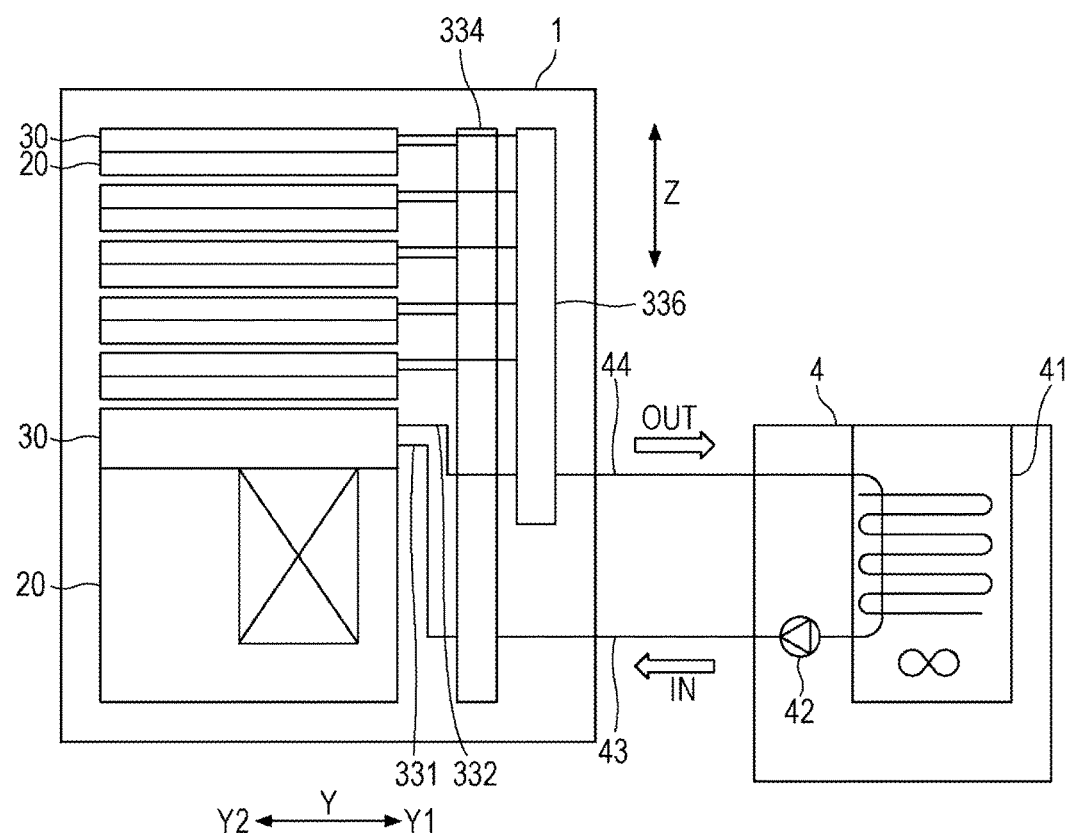
FIG. 13 is a diagram that schematically illustrates one example of a liquid cooling system that includes the liquid cooling server.

FIG. 13 is a diagram that schematically illustrates one example of a liquid cooling system 2 that includes the liquid cooling server 1. In FIG. 13, the liquid cooling server 1 is very simply illustrated in a side view as a view as seen in the X direction. In FIG. 13, an internal portion of the liquid cooling server 1 is illustrated by a see-through view, and only the lowermost unit case 20 and the cooling module 30 are diagrammatically illustrated while being enlarged. The same applies to FIG. 14 described later.

The liquid cooling system 2 includes the liquid cooling server 1 and a cooling device 4. The cooling device 4 may be a chiller or the like. The cooling device 4 includes a heat exchanger 41 and a pump 42. The cooling medium from which heat is taken via the heat exchanger 41 is delivered to the liquid cooling server 1 by the pump 42 via a supply path 43 (see arrow "IN" in FIG. 13). The cooling medium that is delivered to the liquid cooling server 1 in such a way branches to the supply pipes 331 of the respective cooling modules 30 via a branching pipe 334 and is introduced into the flow paths 38 of the respective cooling modules 30. The cooling medium that passes through the flow path 38 takes heat of the cooling plate 32. In such a way, while passing through the flow path 38, the cooling medium takes heat from the heat generating components 21 via the cooling plate 32, the heat transfer bodies 36, the metal plates 34, the portion to be cooled 24 of the unit case 20, and the thermal grease 25. The cooling medium that has passed through the flow path 38 flows to the outside of the cooling modules 30 via the respective outlet pipes 332. The cooling medium that flows to the outside of the cooling modules 30 is caused to merge in a collecting pipe 336 and is thereafter returned to the cooling device 4 via a return path 44 (see arrow "OUT" in FIG. 13). Heat of the cooling medium that is returned to the cooling device 4 is taken by the heat exchanger 41, and the cooling medium is again delivered to the liquid cooling server 1 by the pump 42 via the supply path 43. In such a way, the liquid cooling system 2 illustrated in FIG. 13 causes the cooling medium to circulate and may thereby cool the heat generating components 21 in the liquid cooling server 1. The supply path 43 and the return path 44 may be formed of hoses or the like.

Figure 14:
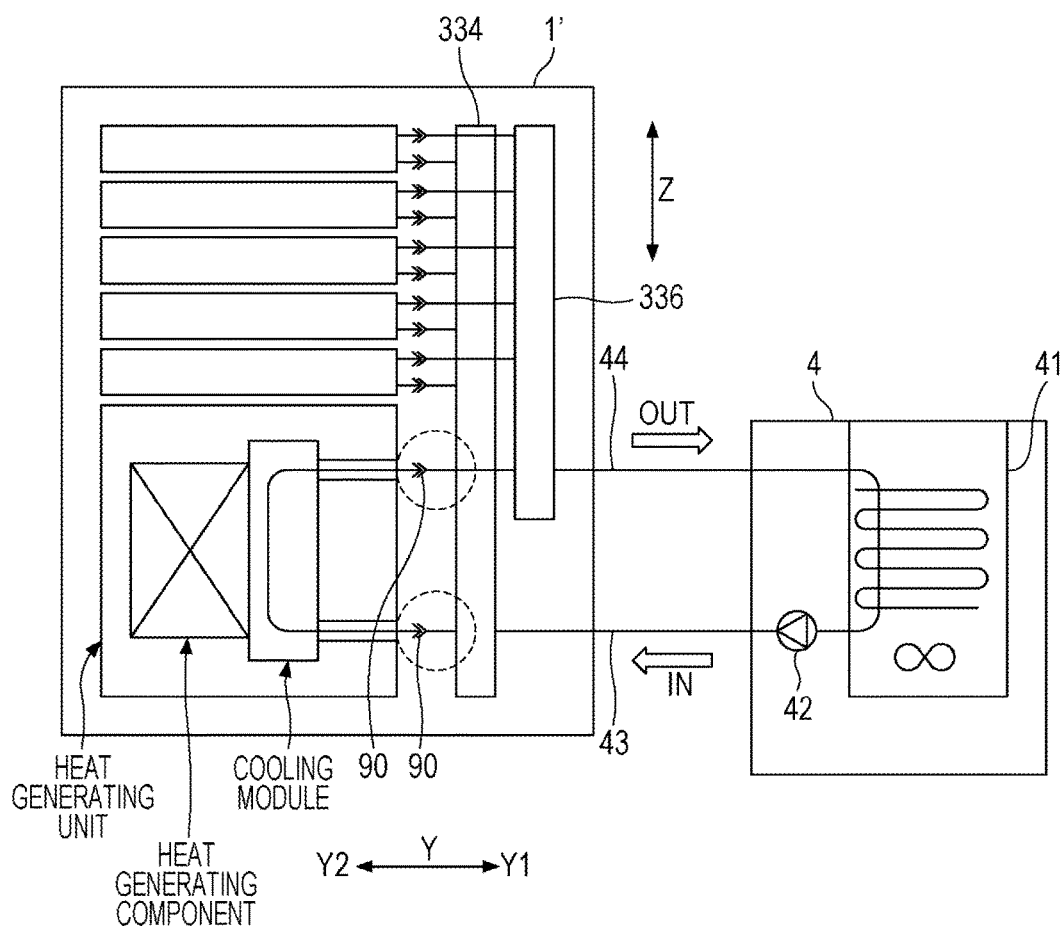
FIG. 14 is a diagram that schematically illustrates a liquid cooling system that includes a liquid cooling server according to a comparative example.

FIG. 14 is a diagram that schematically illustrates a liquid cooling system 2' that includes a liquid cooling server 1' according to a comparative example. The liquid cooling server 1' is different from the first embodiment in a point that a heat generating component and a cooling module are integrally mounted in a unit case. In the description below, "heat generating unit" in the liquid cooling server 1' represents a unit in which the heat generating component and the cooling module are integrated. Specifically, in the liquid cooling server 1', the cooling module is arranged in the unit in which the heat generating component is installed, and the cooling module is tightly fitted to the heat generating component by fixing by plural screws. Such a liquid cooling server 1' may perform cooling by transferring heat from the heat generating component to the cooling water that flows in the cooling module. In the liquid cooling system 2', basically similarly to the liquid cooling system 2, the cooling medium is supplied from the cooling device 4 to the cooling module by the supply path 43, the temperature is lowered by returning the cooling medium at a raised temperature by the return path 44, and the cooling medium is caused to circulate.

Incidentally, the liquid cooling server 1' may request insertion and pulling out of the heat generating unit for maintenance, replacement, and so forth of the heat generating unit. The point that insertion and pulling out of the unit case 20 may be requested for maintenance, replacement, and so forth similarly applies to the liquid cooling server 1 according to the first embodiment. In the comparative example, because the cooling module is mounted in the heat generating unit, in a case of maintenance and replacement of the heat generating unit, the heat generating unit has to be separated from a cooling water supply route (the supply path 43 and the return path 44). Thus, in the liquid cooling server 1' according to the comparative example, couplers 90 (or separation components of similar kinds) (see insides of broken line circles in FIG. 14) are provided on the outside of the heat generating unit, where the couplers 90 are insides of broken line circles in FIG. 14. The coupler 90 is a component for performing connection and separation of a supply route of the cooling medium and is provided with a mechanism that blocks an opening by an internal valve and an O-ring in a case of separation. However, in the case of separation, because a small amount of water drops is spilled, work of wiping by cloth or the like is requested in separation work. Further, although liquid tightness of the flow path is maintained by the O-ring in a case of connection, water possibly leaks in a case where the coupler 90 is not normally connected due to an incorrect operation or a foreign object caught therein. Water leakage has to be detected by a sensor, and supply of the cooling water has to be immediately stopped. This leads to a problem with reliability because a whole system that shares a cooling system is stopped. Further, even in a normal case, handling of the hose (the supply path 43 and the return path 44) with the coupler 90 and work for insertion and pulling out may cause extension of a maintenance time.

In this point, the liquid cooling server 1 according to the first embodiment is not subject to the above-described inconvenience that occurs in the liquid cooling server 1' according to the comparative example. Specifically, as described above, in the liquid cooling server 1 according to the first embodiment, the cooling module 30 and the unit case 20 are separate bodies. Accordingly, in the liquid cooling server 1, even in a case where insertion and pulling out of the unit case 20 are requested for maintenance, replacement, and so forth, as described above with reference to FIG. 11, insertion and pulling out of the unit case 20 may be realized without performing special work for the cooling module 30. That is, in a case of maintenance and replacement of the unit case 20, the cooling module 30 does not have to be separated from the cooling water supply route (the supply path 43 and the return path 44). As a result, the liquid cooling server 1 according to the first embodiment may not request the coupler 90 (or a separation component of a similar kind) that is used in the liquid cooling server 1'. Further, the liquid cooling server 1 according to the first embodiment is not subject to the possibility that a problem such as water leakage occurs in a case of maintenance and replacement of the unit case 20.

[Second Embodiment]

A cooling server according to a second embodiment is different from the liquid cooling server 1 according to the above-described first embodiment in a point that the unit case 20 is substituted by a unit case 20A. The other configurations of the liquid cooling server according to the second embodiment may be similar to the liquid cooling server 1 according to the above-described first embodiment, and descriptions will be simplified or omitted.

Figure 15:
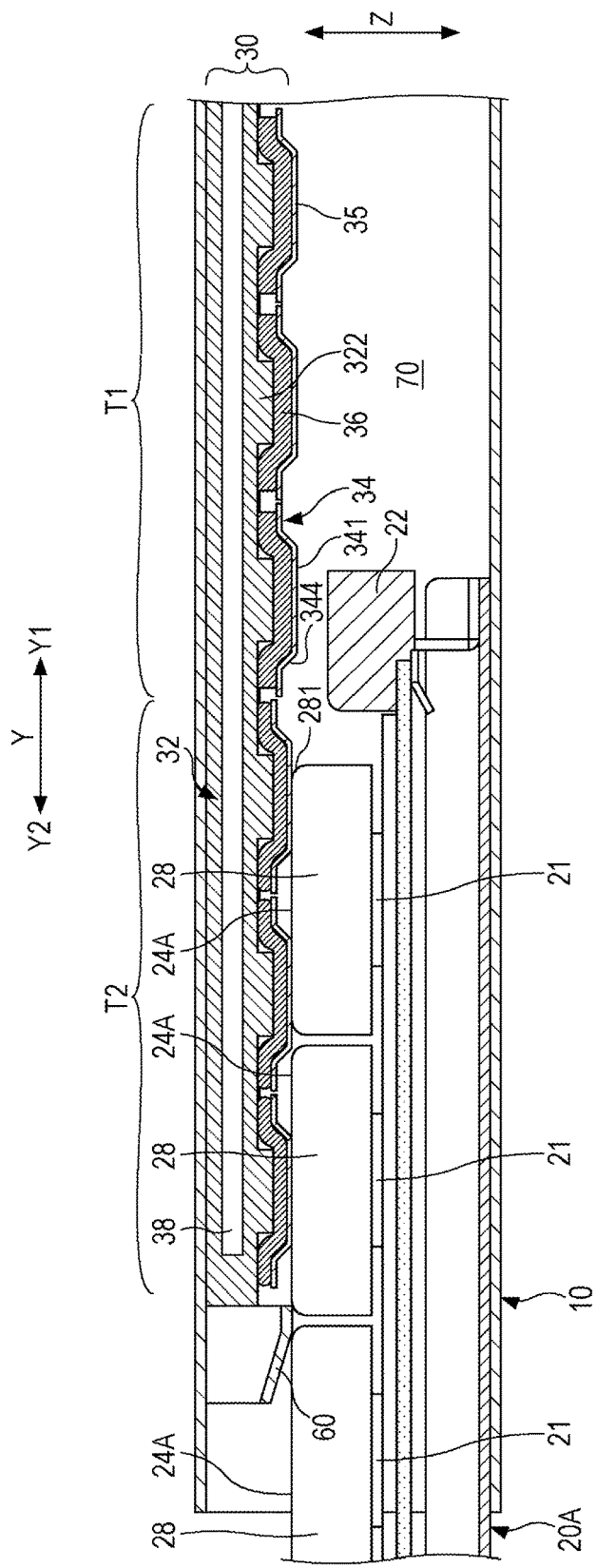
FIG. 15 is an explanatory view of a second embodiment.

FIG. 15 is an explanatory view of the unit case 20A and is a cross-sectional view that illustrates an intermediate state where the unit case 20A is inserted in the unit case housing portion 70.

The unit case 20A is different from the unit case 20 according to the above-described first embodiment in a point that an upper portion is open (not a liquid tight structure) and the thermal grease 25 is not filled therein. Further, the unit case 20A is different from the unit case 20 according to the above-described first embodiment in a point that a heat sink 28 is provided for the heat generating component 21.

The heat sink 28 may be formed of a material with high heat conductivity and may be formed of oxygen-free copper (C10200), for example. As illustrated in FIG. 15, in the heat sink 28, the corner radius is preferably given to a corner portion 281 on an upper side of an end portion in the Y direction so as to facilitate insertion of the unit case 20A in the unit case housing portion 70.

An upper portion of the heat sink 28 forms a portion to be cooled 24A, and an upper surface of the heat sink 28 forms a cooled surface. The upper surface (cooled surface) of the heat sink 28 that is provided for each of the heat generating components 21 extends in substantially the same plane. That is, each of the heat sinks 28 has a contact surface (abutting surface) with the metal plate 34 in the same position in the Z direction. As illustrated in FIG. 15, in a case where the height of each of the heat generating components 21 in the Z direction is the same, the same heat sink 28 may be used for each of the heat generating components 21.

In a case where the unit case 20A is inserted in the unit case housing portion 70, the portion to be cooled 24A of the heat sink 28 abuts the protrusions 35 in the Z direction. As illustrated in region T2 in FIG. 15, in a housed state of the unit case 20A, the metal plates 34 and the protrusions 35 together therewith are displaced upward compared to a state at a time before insertion (see region T1 in FIG. 15). That is, as described above, the metal plates 34 and the protrusions 35 together therewith are displaced upward in response to insertion of the unit case 20A in the unit case housing portion 70. In a case where the metal plates 34 and the protrusions 35 together therewith are displaced upward, the heat transfer bodies 36 are crushed (elastically deformed) in the Z direction. Accordingly, the contact area among the heat transfer body 36, the cooling plate 32, and the metal plate 34 increases, and the heat transfer performance is thereby enhanced. As described above, the second embodiment may provide similar effects to the above-described first embodiment. Note that the liquid cooling server according to the second embodiment may be used instead of the liquid cooling server 1 in the liquid cooling system 2 illustrated in FIG. 13.

Note that the unit case 20A according to the second embodiment and the unit case 20 according to the above-described first embodiment may be housed in the different unit case housing portions 70 of the same chassis 10. That is, the unit case 20A according to the second embodiment and the unit case 20 according to the above-described first embodiment may be used in combination. Further, in a case where the unit case 20A according to the second embodiment and the unit case 20 according to the above-described first embodiment have the same size, the unit case 20A and the unit case 20 may alternatively be housed in the same unit case housing portion 70.

[Third Embodiment]

A cooling server according to a third embodiment is different from the liquid cooling server 1 according to the above-described first embodiment in a point that the unit case 20 is substituted by a unit case 20B and the cooling module 30 is substituted by a cooling plate 32B. The other configurations of the liquid cooling server according to the third embodiment may be similar to the liquid cooling server 1 according to the above-described first embodiment, and descriptions will be simplified or omitted. In the third embodiment, the metal plates 34 and the heat transfer bodies 36 are provided not on the chassis 10 side but on the unit case 20B side.

Figure 16:
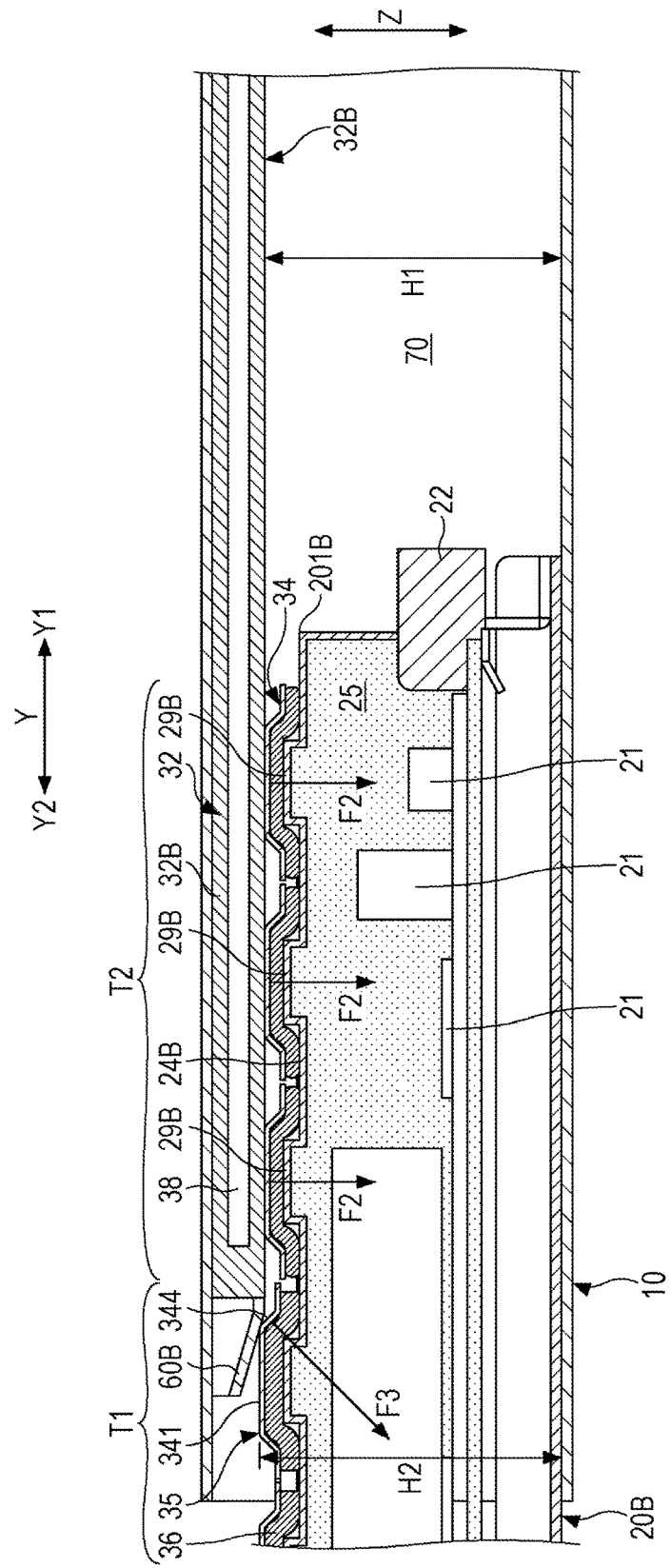
FIG. 16 is an explanatory view of a third embodiment.

FIG. 16 is an explanatory view of the unit case 20B and is a cross-sectional view that illustrates an intermediate state where the unit case 20B is inserted in one certain unit case housing portion 70.

The unit case 20B is different from the unit case 20 according to the above-described first embodiment in a point that the portion to be cooled 24 is substituted by a portion to be cooled 24B and the metal plates 34 and the heat transfer bodies 36 are provided to the unit case 20B.

Specifically, as illustrated in FIG. 16, the unit case 20B includes the portion to be cooled 24B on the side that is opposed to the cooling plate 32B. In the third embodiment, as one example, the portion to be cooled 24B is formed with a member (a sheet metal member, for example) of an upper surface of the unit case 20B. As illustrated in FIG. 16, the portion to be cooled 24B includes plural protrusions 29B that protrude on an upper side on a surface on the side that is opposed to the cooling plate 32B (in the third embodiment, as described above, on an upper side surface as one example). The protrusion 29B is another example of the second protrusion. The plural protrusions 29B are formed in a manner such that those are aligned in the Y direction. Each of the plural protrusions 29B is provided with the metal plate 34. Each of the plural protrusions 29B has a shape that corresponds to the protrusion 35 of the corresponding metal plate 34. Intervals among the plural protrusions 29B in the Y direction are arbitrary but are decided such that the plural metal plates 34 may be aligned in the Y direction so as not to overlap with each other. The plural protrusions 29B are mutually in the same form but may partially be different in the length, width, and so forth. The plural protrusions 29B may be solid but may be formed by shaping sheet metal as illustrated in FIG. 16.

As for the unit case 20B, differently from the corner portion 201 of the unit case 20 according to the above-described first embodiment, a corner portion 201B on an upper side of an end portion on the back side in the Y direction does not abut the cooling plate 32B or the like in a case where the unit case 20B is inserted. Accordingly, a comparatively large corner radius may not be given to the corner portion 201B.

In the third embodiment, the metal plates 34 and the heat transfer bodies 36 are provided not on the chassis 10 side but on the unit case 20B side. That is, in the third embodiment, only the arrangement of the metal plates 34 and the heat transfer bodies 36 is different from the above-described first embodiment. Accordingly, the configuration of the metal plate 34 alone may be similar to the above-described first embodiment. Similarly, the configuration of the heat transfer body 36 alone may be similar to the corresponding one of the above-described first embodiment.

Specifically, the cooling plate 32B is not provided with the metal plate 34 or the heat transfer body 36. Further, the protrusion 322 is not formed either. Accordingly, a lower side surface of the cooling plate 32B is substantially flat. The metal plates 34 are provided to the unit case 20B. The metal plate 34 is arranged such that the side surface 344 is on the back side in the Y direction with respect to the side surface 345 (arranged in the opposite direction to the above-described first embodiment). The metal plate 34 abuts the cooling plate 32B in the Z direction in the housed state of the unit case 20B and has a function, as a heat transfer function, of transferring heat from the unit case 20B to the cooling plate 32B via the heat transfer body 36. Further, by a similar principle to the above-described first embodiment, the metal plate 34 has a function, as an insertion and pulling out facilitation function, of facilitating insertion and pulling out of the unit case 20B. Further, by a similar principle to the above-described first embodiment, the metal plate 34 has a function, as a durability improvement function, of enhancing durability against friction in a case of insertion and pulling out of the unit case 20B.

The heat transfer bodies 36 are provided between the unit case 20B and the plural metal plates 34 in the Z direction. The plural heat transfer bodies 36 respectively make groups with the plural metal plates 34 and the plural protrusions 29B of the unit case 20B. Accordingly, the plural heat transfer bodies 36 are arranged in a manner such that those are aligned in the Y direction similarly to the plural metal plates 34 and the plural protrusions 29B. Each of the plural heat transfer bodies 36 is provided in a manner such that it covers the corresponding protrusion 29B.

As illustrated in region T1 in FIG. 16, in the empty state of the unit case housing portion 70, an upper end portion (top portion) of the protrusion 35 is positioned above the unit case housing portion 70. That is, in the empty state of the unit case housing portion 70, height H2 from the lower side surface of the unit case 20B to the abutting surface 341 in the Z direction is slightly larger than height H1 of the unit case housing portion 70 in the Z direction. Accordingly, when the unit case 20B is inserted, the protrusion 35 is pushed in an obliquely downward direction from a guide member 60B (from the cooling plate 32B in a case where the guide member 60B is not present) (see force F3). In such a way, while the unit case 20B causes the plural metal plates 34 aligned in the Y direction to sequentially withdraw downward from the Y1 side, the unit case 20B may thereby move toward the back side in the Y direction. As described above, because the protrusion 35 of the metal plate 34 includes the inclined side surface 344, the unit case 20B may smoothly be inserted (in a manner such that unevenness is reduced).

In a case where the unit case 20B is inserted in the unit case housing portion 70, the cooling plate 32B abuts the protrusions 35 of the metal plates 34 in the Z direction. As illustrated in region T2 in FIG. 16, in the housed state of the unit case 20B, the metal plates 34 and the protrusions 35 together therewith are displaced downward compared to a state at a time before insertion (see region T1 in FIG. 16). In a case where the metal plates 34 and the protrusions 35 together therewith are displaced downward, the heat transfer bodies 36 are crushed (elastically deformed) in the Z direction. Accordingly, the contact area among the heat transfer body 36, the portion to be cooled 24B, and the metal plate 34 increases, and the heat transfer performance is thereby enhanced.

As described above, the third embodiment may provide similar effects to the above-described first embodiment. Note that the liquid cooling server according to the third embodiment may be used instead of the liquid cooling server 1 in the liquid cooling system 2 illustrated in FIG. 13.

In the third embodiment, the thermal grease 25 is filled in the unit case 20B similarly to the above-described first embodiment. However, similarly to the above-described second embodiment, an upper portion may be open (not a liquid tight structure), and the thermal grease 25 may be omitted. In this case, a protrusion is provided on the upper surface of the heat sink 28, which is described in the above-described second embodiment, and the metal plate 34 and the heat transfer body 36 may be provided to the protrusion.

In the foregoing, the embodiments have been described in detail. However, the techniques described herein are not limited to specific embodiments, but various modifications and alterations are possible within the scope of the claims. Further, it is possible to combine all or plural configuration elements of the above-described embodiments.

For example, in the above-described first embodiment, the metal plate 34 is supported by the support member 50 so as to be displaceable in the Z direction. However, embodiments are not limited to this. For example, the metal plate 34 may be adhered to the heat transfer body 36 by a thermally conductive adhesive. In this case, the heat transfer body 36 may be adhered to the protrusion 322 by a thermally conductive adhesive. Such a modification example may be realized in substantially the same manner in the other second and third embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid cooling server that cools a heat generating component via a liquid cooling medium, the liquid cooling server comprising:
   a chassis configured to include a unit case housing portion;
   a unit case configured to be allowed to move in a first direction to be inserted in and pulled out from the unit case housing portion and include the heat generating component and a portion to be cooled;
   a cooling plate configured to be provided to the chassis, oppose the unit case housing portion in a second direction perpendicular to the first direction, and include a flow path through which the cooling medium flows;
   a metal portion configured to be provided to a first member which is either one of the cooling plate and the portion to be cooled, the metal portion including a plurality of first protrusions which protrude in the second direction towards a side of the unit case housing portion, the plurality of first protrusions being arranged in the first direction; and a heat transfer body configured to be provided between the metal portion and the first member in the second direction, the heat transfer body having elasticity.

2. The liquid cooling server according to claim 1, wherein the metal portion is provided to the first member so as to be displaceable in the second direction with respect to the first member, and
the plurality of first protrusions abut a second member in the second direction in a state where the unit case is housed in the unit case housing portion, the second member being another of the cooling plate and the portion to be cooled.

3. The liquid cooling server according to claim 1, wherein the heat transfer body is formed in a flat sheet shape, and
the first member includes second protrusions that protrude in the second direction towards the side of the unit case housing portion in respective positions that correspond to the plurality of first protrusions of the metal portion.

4. The liquid cooling server according to claim 1, wherein in the metal portion, the plurality of first protrusions are displaceable in the second direction independently from each other.

5. The liquid cooling server according to claim 1, wherein the metal portion is displaced in a direction to approach the first member in the second direction due to insertion of the unit case in the unit case housing portion, and
the heat transfer body elastically deforms due to displacement of the metal portion.

6. The liquid cooling server according to claim 5, wherein the heat transfer body elastically deforms into a protruding shape that fits in a corresponding one if the first protrusions.

7. The liquid cooling server according to claim 1, wherein the heat transfer body is separately and individually provided with respect to each of the plurality of first protrusions.

8. The liquid cooling server according to claim 1, wherein the first member is the cooling plate, and
a cooling module in which the cooling plate, the metal portion, and the heat transfer body are integrated is fixed to the chassis.

9. The liquid cooling server according to claim 1, wherein the first member is the cooling plate,
each of the plurality of first protrusions includes an abutting surface that abuts the portion to be cooled in the second direction in the state where the unit case is housed in the unit case housing portion and a side surface that is integral with the abutting surface from an entrance side of the unit case housing portion in the first direction, and
the side surface is inclined with respect to the abutting surface in a direction in which a close side to the abutting surface is closer to a back side of the unit case housing portion in the first direction than a far side from the abutting surface.

10. The liquid cooling server according to claim 9, wherein an angle that is formed between the side surface and the abutting surface is in a range of 40 to 50 degrees.

11. The liquid cooling server according to claim 1, wherein the metal portion is formed with a plurality of metal plates, and the plurality of metal plates respectively form the plurality of first protrusions.

12. The liquid cooling server according to claim 11, further comprising:
support members that are provided for both ends of the plurality of metal plates in a third direction and support the plurality of metal plates such that the plurality of metal plates are displaceable in the second direction with respect to the chassis in a case where the third direction is perpendicular to each of the first direction and the second direction.

13. The liquid cooling server according to claim 1, wherein thermal grease is filled in the unit case.

14. The liquid cooling server according to claim 1, wherein the first member is the cooling plate, and
the unit case accommodates a plurality of heat sinks that respectively form the portion to be cooled in a same position in the second direction.

15. The liquid cooling server according to claim 1, wherein the first member is the cooling plate, and
in a state where the unit case is not housed in the unit case housing portion, end portions of the plurality of first protrusions on the side of the unit case housing portion in the second direction are positioned in a space of the unit case housing portion.

16. The liquid cooling server according to claim 1, wherein widths of the plurality of first protrusions in the first direction narrow toward sides of top portions of protruding shapes in the second direction.

17. The liquid cooling server according to claim 1, wherein the first member is the unit case,
each of the plurality of first protrusions includes an abutting surface that abuts the cooling plate in the second direction in the state where the unit case is housed in the unit case housing portion and a side surface that is integral with the abutting surface from a back side of the unit case housing portion in the first direction, and
the side surface is inclined with respect to the abutting surface in a direction in which a close side to the abutting surface is closer to an entrance side of the unit case housing portion in the first direction than a far side from the abutting surface.

18. The liquid cooling server according to claim 1, wherein the plurality of first protrusions extend in linear shapes in a third direction that is perpendicular to each of the first direction and the second direction.

19. The liquid cooling server according to claim 1, wherein the first member is the cooling plate, and
a corner portion of the unit case on a side of the cooling plate in the second direction in an end portion on a back side of the unit case housing portion in the first direction has a corner radius.

* * * * *